United States Patent
Kohara et al.

(10) Patent No.: US 8,102,942 B2
(45) Date of Patent: Jan. 24, 2012

(54) VSB MODULATION APPARATUS AND METHOD FOR GENERATING A VSB-MODULATED WAVE

(75) Inventors: Norikazu Kohara, Hachioji (JP); Seiichiro Horikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 785 days.

(21) Appl. No.: 12/120,794

(22) Filed: May 15, 2008

(65) Prior Publication Data
US 2008/0292018 A1 Nov. 27, 2008

(30) Foreign Application Priority Data
May 23, 2007 (JP) ................................. 2007-136887

(51) Int. Cl.
*H04L 27/36* (2006.01)

(52) U.S. Cl. ..................................................... 375/298
(58) Field of Classification Search .................. 375/295, 375/298, 316, 350; 455/20, 308, 313
See application file for complete search history.

(56) References Cited

U.S. PATENT DOCUMENTS

| 5,430,487 A * | 7/1995 | Naimpally | 375/240.25 |
| 5,978,420 A * | 11/1999 | Koslov et al. | 375/295 |
| 7,245,668 B2 * | 7/2007 | Feher | 375/295 |

FOREIGN PATENT DOCUMENTS

| JP | 6-217210 | 8/1994 |
| JP | 10-270945 | 10/1998 |

* cited by examiner

*Primary Examiner* — David C. Payne
*Assistant Examiner* — Leon-Viet Nguyen
(74) *Attorney, Agent, or Firm* — Finnegan, Henderson, Farabow, Garrett & Dunner, L.L.P.

(57) ABSTRACT

A vestigial sideband (VSB) modulation apparatus includes a signal processing unit which extracts an I-axis data signal component and a Q-axis data signal component from a baseband signal with symbol data superimposed thereon, a band-limiting filter which frequency-shifts the I-axis data signal component and the Q-axis data signal component, extracted by the signal processing unit, by only a specific frequency smaller than a rate of the symbol data and limits a passband width by a frequency width smaller than the rate of the symbol data, and a quadrature modulating unit which obtains a VSB modulation signal by quadrature-modulating the I-axis data signal component and the Q-axis data signal component output from the band-limiting filter.

6 Claims, 2 Drawing Sheets

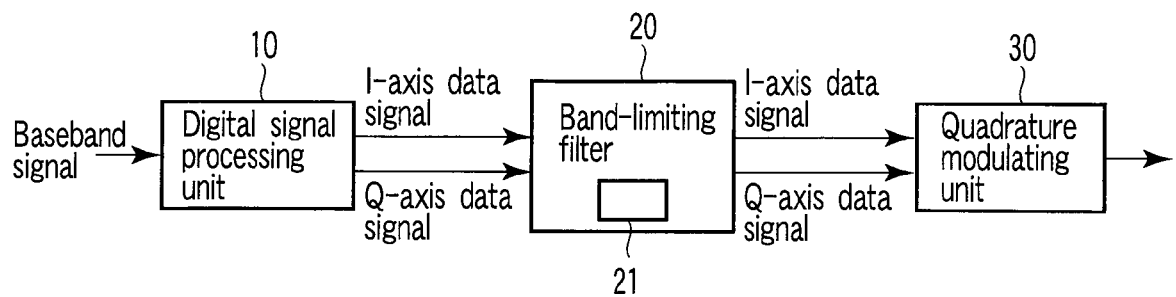
F I G. 1
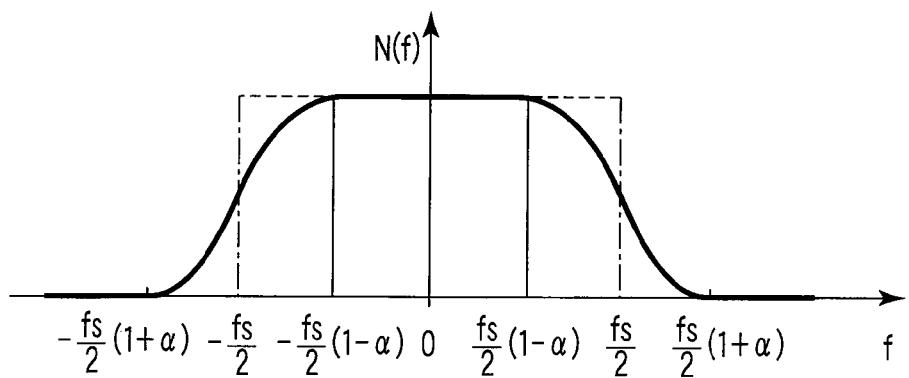
F I G. 2
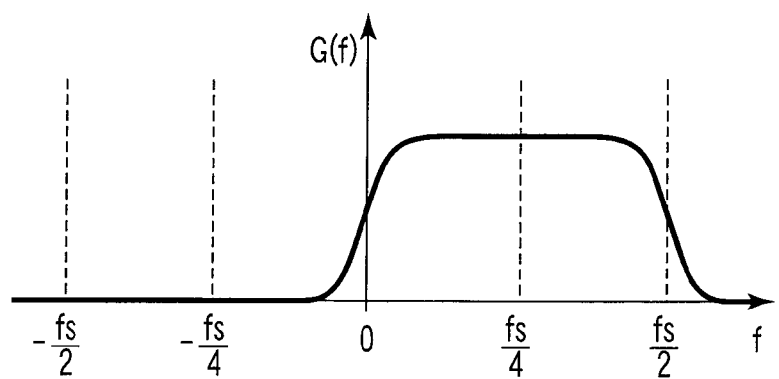
F I G. 3

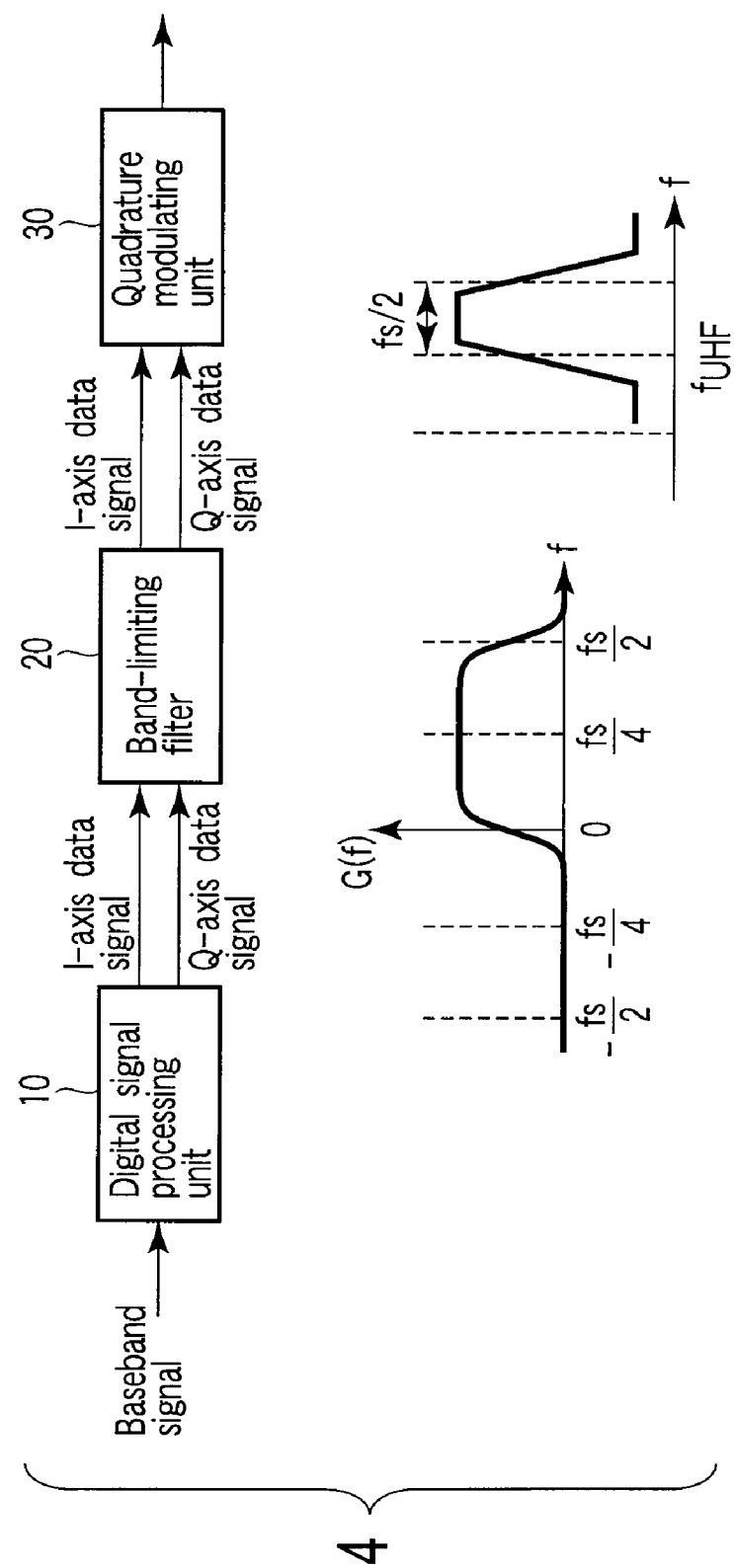
F I G. 4

US 8,102,942 B2

VSB MODULATION APPARATUS AND METHOD FOR GENERATING A VSB-MODULATED WAVE

CROSS-REFERENCE TO RELATED APPLICATIONS

This application is based upon and claims the benefit of priority from prior Japanese Patent Application No. 2007-136887, filed May 23, 2007, the entire contents of which are incorporated herein by reference.

BACKGROUND OF THE INVENTION

1. Field of the Invention

The present invention relates to a vestigial sideband (VSB) modulation apparatus, which is used in a transmission device and the like for digital television broadcasting, for example, and generates a VSB waveform, and a method for generating a VSB-modulated wave.

2. Description of the Related Art

In a well-known VSB modulation apparatus, an input baseband signal is converted into an I-axis data signal and a Q-axis data signal by a digital signal processing unit, and each frequency band of these I-axis data signal and Q-axis data signal is limited by a band-limiting filter. In the VSB modulation apparatus, a quadrature modulating unit quadrature-modulates the I-axis data signal and Q-axis data signal output from this band-limiting filter with a carrier wave in an intermediate-frequency (IF) band and generates a double-sideband-modulated wave. The VSB modulation apparatus frequency-converts the double-sideband-modulated wave from the IF band to an ultra-high-frequency (UHF) band by a UHF up-converter, and thereafter removes a part of the modulated wave by an analog filter to thereby reshape the double-sideband-modulated wave into a VSB-modulated wave.

The VSB modulation apparatus is strongly required to be reduced in the circuit size and the equipment cost. However, in the reshaping into the correct VSB-modulated wave, since the performance requirement for the analog filter is stringent, mounting the analog filter in the VSB modulation apparatus substantially restricts the reduction of circuit size and equipment cost. Additionally, when the baseband signals of a plurality of channels are to be transmitted, an exclusive analog filter is required for each channel.

There is an example which provides a binary digital signal to a baseband shaping filter and samples the signal in the baseband shaping filter to perform calculation, and thus, to convert the binary digital signal into a baseband signal having a real part and an imaginary part, whereby the digital signal undergoes VSB modulation without using the analog filter (for example, see Jpn. Pat. Appln. KOKAI Publication No. 10-270945). Additionally, there is an example in which a video signal to be input is converted into an amplitude-modulated signal and a phase-modulated signal to phase-modulate a carrier wave in response to the phase-modulated signal, and thus, to amplitude-modulate the phase-modulated carrier wave in response to the amplitude-modulated signal, whereby the VSB-modulated wave is obtained without using the analog filter (for example, see Jpn. Pat. Appln. KOKAI Publication No. 6-217210).

However, the above conventional examples attempt the reduction of circuit size and equipment cost by eliminating the analog filter; therefore, processing for generating the VSB-modulated wave is complicated, leading to the occurrence of error.

BRIEF SUMMARY OF THE INVENTION

An object of the invention is to provide a VSB modulation apparatus and a method for generating a VSB-modulated wave, which can generate a VSB-modulated wave by a simple operation with high accuracy and can realize the reduction of circuit size and equipment cost.

According to an aspect of the present invention, there is provided a vestigial sideband (VSB) modulation apparatus comprising: a signal processing unit which extracts an I-axis data signal component and a Q-axis data signal component from a baseband signal with symbol data superimposed thereon; a band-limiting filter which frequency-shifts the I-axis data signal component and the Q-axis data signal component, extracted by the signal processing unit, by only a specific frequency smaller than a rate of the symbol data and limits a passband width by a frequency width smaller than the rate of the symbol data; and a quadrature modulating unit which obtains a VSB modulation signal by quadrature-modulating the I-axis data signal component and the Q-axis data signal component output from the band-limiting filter.

Additional objects and advantages of the invention will be set forth in the description which follows, and in part will be obvious from the description, or may be learned by practice of the invention. The objects and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a configuration of one embodiment of a VSB modulation apparatus according to the invention;

FIG. 2 is a conceptual diagram showing a frequency characteristic of a normal Nyquist filter;

FIG. 3 is a conceptual diagram showing a frequency characteristic of a band-limiting filter of the above embodiment; and FIG. 4 is a conceptual diagram showing signal processing by each component of the VSB modulation apparatus of the above embodiment.

DETAILED DESCRIPTION OF THE INVENTION

Hereinafter, an embodiment of the invention will be described in detail with reference to the drawings.

FIG. 1 is a block diagram showing a functional configuration of a VSB modulation apparatus according to one embodiment of the invention. In FIG. 1, a baseband signal with symbol data of a symbol rate $f_s$ superimposed thereon is converted into an I-axis data signal and a Q-axis data signal by a digital signal processing unit 10, and band-limited by a band-limiting filter 20. At this time, a frequency response spectrum of the band-limiting filter 20 is shifted from the center by only $f_s/4$. In addition the passband width of the frequency spectrum is narrowed to $f_s/2$. The I-axis data signal and the Q-axis data signal pass through the band-limiting filter 20, to thereby become signals equivalent to a VSB-modulated wave corresponding to the respective signals. The I-axis data signal and the Q-axis data signal having passed through the band-limiting filter 20 are respectively quadrature-modulated with a carrier wave in a UHF band by a quadrature modulating unit 30, and then output as the VSB-modulated wave in the UHF band.

The band-limiting filter 20 uses a complex filter 21 as a roll-off filter to frequency-shift the frequency response spectrum of the band-limiting filter 20. In addition, the band-limiting filter 20 narrows the bandwidth of the roll-off filter to narrow the passband width of the frequency response spectrum of the band-limiting filter 20.

Next, a frequency response and impulse response of the band-limiting filter 20 of the VSB modulation apparatus in this embodiment will be described in detail by using an Advanced Television Systems Committee (ATSC) system as an example.

A frequency response N (f) of a normal Nyquist filter is represented by the following expression (1):

$$N(f) = \begin{cases} 1 & \left(|f| < \frac{(1-\alpha)f_s}{2}\right) \\ \cos^2\frac{\pi\left\{|f| - (1-\alpha)\frac{f_s}{2}\right\}}{2\alpha f_s} & \left(\frac{(1-\alpha)f_s}{2} < |f| < \frac{(1-\alpha)f_s}{2}\right) \\ 0 & \left(|f| > \frac{(1-\alpha)f_s}{2}\right) \end{cases} \quad (1)$$

Where, f, $f_s$, and $\alpha$ represent a carrier frequency, a symbol rate, and a roll-off rate, respectively. The frequency characteristic of this Nyquist filter is shown in FIG. 2. The frequency characteristic which is frequency-shifted by only $f_s/2$ by the complex filter is the frequency characteristic of the band-limiting filter 20 with the ATSC system. At this time, the bandwidth of the complex filter is $f_s$. Thus, the frequency response G (f) of the band-limiting filter 20 with the ATSC system is represented by the following expression (2):

$$G(f) = N\left(f - \frac{f_s}{2}\right)$$

$$= \begin{cases} 1 & \left(\frac{\alpha f_s}{2} < f < \frac{(2-\alpha)f_s}{2}\right) \\ \cos^2\frac{\pi\left\{\left|f - \frac{f_s}{2}\right| - \frac{(1-\alpha)f_s}{2}\right\}}{2\alpha f_s} & \\ & \left(\frac{(2-\alpha)f_s}{2} < f < \frac{(2+\alpha)f_s}{2}, -\frac{\alpha f_s}{2} < f < \frac{\alpha f_s}{2}\right) \\ 0 & \left(f < -\frac{\alpha f_s}{2}, f > \frac{(2+\alpha)f_s}{2}\right) \end{cases}$$

Meanwhile, when a route Nyquist filter is adopted, the frequency response of the band-limiting filter 20 is represented by the following expression (3):

$$H_{TX}(f) = H_{RX}(f) = \sqrt{G(f)} \quad (3)$$

Thus, the frequency response of the band-limiting filter 20 is represented by the following expression (4):

$$H_{TX}(f) = \quad (4)$$

$$\begin{cases} 1 & \left(\frac{\alpha f_s}{2} < f < \frac{(2-\alpha)f_s}{2}\right) \\ \cos^2\frac{\pi\left\{\left|f - \frac{f_s}{2}\right| - \frac{(1-\alpha)f_s}{2}\right\}}{2\alpha f_s} & \\ & \left(\frac{(2-\alpha)f_s}{2} < f < \frac{(2+\alpha)f_s}{2}, -\frac{\alpha f_s}{2} < f < \frac{\alpha f_s}{2}\right) \\ 0 & \left(f < -\frac{\alpha f_s}{2}, f > \frac{(2+\alpha)f_s}{2}\right) \end{cases}$$

The frequency response of the band-limiting filter 20 subjected to inverse Fourier transformation is the impulse response of the band-limiting filter 20. The impulse response of the band-limiting filter 20 is represented by the following expression (5):

$$h(f) = \qquad (5)$$

$$\begin{cases} \left[ \dfrac{1}{\pi t\{1-(4\alpha f_s t)^2\}} \sin\pi(1-\alpha)f_s t \right. \\ \left. + \dfrac{4\alpha f_s}{1-(4\alpha f_s t)^2} \cos\pi(1+\alpha)f_s t \right] \exp(j\pi f_s t) & \left( t \neq 0, \dfrac{1}{4\alpha f_s} \right) \\ \left( 1 - \alpha + \dfrac{4\alpha}{\pi} \right) f_s & (t = 0) \\ \dfrac{\alpha f_s}{\sqrt{2}} \left\{ \left( 1 - \dfrac{2}{\pi} \right) \cos\dfrac{\pi}{4\alpha} + \left( 1 + \dfrac{2}{\pi} \right) \sin\dfrac{\pi}{4\alpha} \right\} \exp\left( j\pi f_s \dfrac{1}{4\alpha f_s} \right) & \left( t = \dfrac{1}{4\alpha f_s} \right) \end{cases}$$

However, since a symbol rate $f_s'$ used in the ATSC system is half of the symbol rate $f_s$ used in this embodiment ($f_s'=f_s/2$), it is redefined by the following expression (6):

$$h(f) = \qquad (6)$$

$$\begin{cases} \left[ \dfrac{1}{\pi t\{1-(4\alpha f_s' t)^2\}} \sin\pi(1-\alpha)f_s' t \right. \\ \left. + \dfrac{4\alpha f_s'}{1-(4\alpha f_s' t)^2} \cos\pi(1+\alpha)f_s' t \right] \exp(j\pi f_s' t) & \left( t \neq 0, \dfrac{1}{4\alpha f_s'} \right) \\ \left( 1 - \alpha + \dfrac{4\alpha}{\pi} \right) f_s' & (t = 0) \\ \dfrac{\alpha f_s'}{\sqrt{2}} \left\{ \left( 1 - \dfrac{2}{\pi} \right) \cos\dfrac{\pi}{4\alpha} + \left( 1 + \dfrac{2}{\pi} \right) \sin\dfrac{\pi}{4\alpha} \right\} \exp\left( j\pi f_s' \dfrac{1}{4\alpha f_s} \right) & \left( t = \dfrac{1}{4\alpha f_s'} \right) \end{cases}$$

Thereby, the frequency characteristic of the band-limiting filter 20 with the ATSC system in this embodiment can be obtained as shown in FIG. 3.

Next, signal processing of the VSB modulation apparatus in this embodiment will be described. FIG. 4 shows signal processing of the VSB modulation apparatus according to one embodiment of the invention.

In FIG. 4, a baseband signal is converted into the I-axis data signal and the Q-axis data signal by the digital signal processing unit 10. Each of the I-axis data signal and Q-axis data signal is band-limited by the band-limiting filter 20. The frequency characteristic of the band-limiting filter 20 is obtained by frequency-shifting a frequency response spectrum of the normal Nyquist filter by only $f_s/4$ and by narrowing the passband width thereof to the bandwidth equivalent to $f_s/2$. The band-limited I-axis data signal and Q-axis data signal are respectively quadrature-modulated with a carrier wave in a UHF band by the quadrature modulating unit 30 to be output as the VSB-modulated wave in the UHF band.

Namely, in the above embodiment, the band-limiting filter 20 has the frequency characteristic obtained by frequency-shifting the frequency characteristic of the normal Nyquist filter by only $f_s/4$ and, at the same time, narrowing the passband width thereof to $f_s/2$. Thus, in the VSB modulation apparatus, only by passing the baseband signals, which have been converted into the I-axis data signal and the Q-axis data signal by the digital signal processing unit 10, through the band-limiting filter 20 having the above frequency characteristic, signals equivalent to the VSB-modulated wave corresponding to the respective I-axis data signal and the Q-axis data signal can be produced. Then, the I-axis data signal and the Q-axis data signal are quadrature-modulated by the quadrature modulating unit 30, whereby the VSB-modulated wave can be generated.

Thus, according to the VSB modulation apparatus with the above constitution, it is possible to realize reduction in size and cost because the VSB-modulated wave can be produced even if the analog filter, which has conventionally restricted the reduction of circuit size and equipment cost, is not used. In addition, since the VSB-modulated wave can be produced by changing the amount of the frequency shift of the frequency characteristic of the band-limiting filter 20 and the bandwidth of the band-limiting filter 20, complicated processing is not required. Specifically, when baseband signals of a plurality of channels are to be transmitted, since an exclusive analog filter for each channel is not required, it is possible to further reduce the circuit size and the equipment cost of the VSB modulation apparatus.

In the above embodiment, the example in which the baseband signal is divided into the I-axis data signal and the Q-axis data signal by the digital signal processing unit 10 has been described. The invention is not limited to this example, but applicable to a case in which the I-axis data signal component and the Q-axis data signal component are respectively extracted from the baseband signal in the band-limiting filter 20, whereby the signals equivalent to the VSB-modulated wave are obtained from these components.

Further, in the above embodiment, the example in which the spectrum of the band-limiting filter 20 is shifted from the center to a higher frequency side by only $f_s/4$ has been described. However, this spectrum shift is also applicable to a case in which the spectrum is frequency-shifted from the center to the higher or lower frequency side by a frequency smaller than the symbol rate $f_s$.

Moreover, in the above embodiment, the example in which the passband width of the band-limiting filter 20 is narrowed to $f_s/2$ has been described. However, the bandwidth is not limited to $f_s/2$, but also applicable to the bandwidth smaller than the symbol rate $f_s$.

The invention is not limited to the above embodiment, but also applicable to other communication systems than the digital television broadcast system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vestigial sideband (VSB) modulation apparatus comprising:
   a signal processing unit which extracts an in-phase axis data signal component and a quadrature axis data signal component from a baseband signal with symbol data superimposed thereon;
   a band-limiting filter which limits a passband width of the in-phase axis data signal component and the quadrature axis data signal component, extracted by the signal processing unit, by a frequency width smaller than a rate of the symbol data and frequency-shifts the in-phase axis data signal component and the quadrature axis data signal component by only a specific frequency corresponding to a half of the frequency width;
   wherein when the rate of the symbol data is represented by $f_s$, in the band-limiting filter, the amount of the frequency shift is $f_s/4$; and
   a quadrature modulating unit which obtains a VSB modulation signal by quadrature-modulating the in-phase axis data signal component and the quadrature axis data signal component output from the band-limiting filter.

2. The VSB modulation apparatus according to claim 1, wherein the quadrature modulating unit applies a frequency conversion processing to each of the components output from the band-limiting filter.

3. The VSB modulation apparatus according to claim 2, wherein the quadrature modulating unit directly modulates each of the components output from the band-limiting filter into radio-frequency band signals.

4. A method for generating a vestigial sideband (VSB)-modulated wave comprising:
   extracting an in-phase axis data signal component and a quadrature axis data signal component from a baseband signal with symbol data superimposed thereon;
   limiting a passband width of the in-phase axis data signal component and the quadrature axis data signal component, extracted by the signal processing unit, by a frequency width smaller than a rate of the symbol data and frequency-shifting the in-phase axis data signal component and the quadrature axis data signal component by only a specific frequency corresponding to a half of the frequency width;
   wherein when the rate of the symbol data is represented by $f_s$, in the band-limiting filter, the amount of the frequency shift is $f_s/4$; and
   quadrature-modulating the in-phase axis data signal component and the quadrature axis data signal component to which the frequency shift and the band limitation are applied to obtain a VSB modulation signal.

5. The method for generating a VSB-modulated wave according to claim 4, wherein in the quadrature modulation, a frequency conversion processing is applied to a signal equivalent to the VSB-modulated wave corresponding to the in-phase axis data signal component and a signal equivalent to the VSB-modulated wave corresponding to the quadrature axis data signal component.

6. The method for generating a VSB-modulated wave according to claim 5, wherein in the quadrature modulation, a signal equivalent to the VSB-modulated wave corresponding to the in-phase axis data signal component and a signal equivalent to the VSB-modulated wave corresponding to the quadrature axis data signal component are directly modulated into radio-frequency band signals.

* * * * *